United States Patent
Kim

(10) Patent No.: US 8,816,579 B2
(45) Date of Patent: Aug. 26, 2014

(54) ORGANIC LIGHT-EMITTING DEVICE AND METHOD OF MANUFACTURING THE SAME

(75) Inventor: Young-Il Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 138 days.

(21) Appl. No.: 13/356,902

(22) Filed: Jan. 24, 2012

(65) Prior Publication Data

US 2013/0038203 A1    Feb. 14, 2013

(30) Foreign Application Priority Data

Aug. 12, 2011  (KR) .................. 10-2011-0080652

(51) Int. Cl.
*H01L 51/52*  (2006.01)
*H01L 51/50*  (2006.01)

(52) U.S. Cl.
USPC .............................. 313/504; 313/505; 257/88

(58) Field of Classification Search
CPC ...... H05B 33/26; H05B 33/145; H05B 33/28; H05B 33/00; H05B 33/02; H05B 33/0896; H01L 27/3246; H01L 51/5203; H01L 51/441
USPC .................. 313/498–512; 257/88–93
See application file for complete search history.

(56) References Cited

U.S. PATENT DOCUMENTS

| 7,683,535 B2 | 3/2010 | Fukunaga et al. |
| 2005/0153468 A1 | 7/2005 | Gupta et al. |
| 2006/0091791 A1 | 5/2006 | Shin |
| 2006/0238111 A1 | 10/2006 | Shimizu et al. |
| 2008/0315756 A1* | 12/2008 | Jeon et al. ..................... 313/504 |
| 2009/0058283 A1 | 3/2009 | Tanaka et al. |
| 2010/0164377 A1* | 7/2010 | Shimizu et al. ............... 313/504 |
| 2010/0171419 A1 | 7/2010 | Kim et al. |
| 2010/0181559 A1 | 7/2010 | Nakatani et al. |

FOREIGN PATENT DOCUMENTS

| EP | 2242334 A1 | 10/2010 |
| JP | 2002-198182 A | 7/2002 |
| JP | 2005-268024 A | 9/2005 |
| KR | 10-2006-0037857 A | 5/2006 |
| KR | 10-0784487 B | 12/2007 |
| KR | 10-2010-0027150 A | 3/2010 |
| KR | 10-2010-0081771 A | 7/2010 |

OTHER PUBLICATIONS

Extended European Search Report Dated Feb. 24, 2014.

* cited by examiner

*Primary Examiner* — Karabi Guharay
*Assistant Examiner* — Nathaniel Lee
(74) *Attorney, Agent, or Firm* — Lee & Morse, P.C.

(57) ABSTRACT

An organic light-emitting device includes a first pixel electrode disposed on a substrate, a first bank covering an edge of the first pixel electrode, the first bank having a first opening exposing a portion of the first pixel electrode, a second pixel electrode covering the exposed portion of the first pixel electrode through the first opening, the second pixel electrode covering at least a portion of the first bank, an organic light-emitting layer covering the second pixel electrode, and an opposite electrode covering the organic light-emitting layer.

19 Claims, 5 Drawing Sheets

ORGANIC LIGHT-EMITTING DEVICE AND METHOD OF MANUFACTURING THE SAME

BACKGROUND

1. Field of the Invention

Example embodiments relate to an organic light-emitting device and a method of manufacturing the same, and more particularly, to an organic light-emitting device with improved photoluminescence efficiency and a method of manufacturing the same.

2. Description of the Related Art

Organic light-emitting display apparatuses operate at a low voltage, are light-weight, and have small thicknesses, a wide viewing angle, a high contrast ratio, and a high response speed. Due to these merits, they are regarded as next-generation apparatuses.

SUMMARY OF THE INVENTION

Example embodiments provide an organic light-emitting device with photoluminescence efficiency that is improved due to the inclusion of two pixel electrodes and a method of manufacturing the same.

Example embodiments also provide an organic light-emitting device in which light-emission at an edge of a light-emitting portion is suppressed to improve the quality of extracted light when the organic light-emitting device is manufactured by printing and a method of manufacturing the same.

According to an aspect of the example embodiments, there is provided an organic light-emitting device, including a first pixel electrode disposed on a substrate, a first bank covering an edge of the first pixel electrode, the first bank having a first opening exposing a portion of the first pixel electrode, a second pixel electrode covering the exposed portion of the first pixel electrode through the first opening, the second pixel electrode covering at least a portion of the first bank, an organic light-emitting layer covering the second pixel electrode, and an opposite electrode covering the organic light-emitting layer.

The first pixel electrode and the second pixel electrode may include materials having different refractive indices.

The second pixel electrode may be directly between the first pixel electrode and the organic light emitting layer, the first and second pixel electrodes being in direct surface contact.

First respective parts of the first and second pixel electrodes may be in direct contact with each other, and a portion of the first bank may be between respective second parts of the first and second banks.

A thickness of the first bank may be about 1 μm or less.

The organic light-emitting device may further include a second bank on the first bank, the second bank including a second opening wider than the first opening and exposing the second pixel electrode.

The first bank and the second bank may include a same organic material.

The second pixel electrode may include at least one of ITO, IZO, ZnO, $In_2O_3$, IGO, and IZO.

A thickness of the second pixel electrode may be about 100 nm or less.

The second pixel electrode may include a metallic material.

A thickness of the second pixel electrode may be about 10 nm or less.

According to another aspect of the example embodiments, there is provided a method of manufacturing an organic light-emitting device, the method include forming a first pixel electrode on a substrate, forming a first bank covering an edge of the first pixel electrode, the first bank having a first opening exposing a portion of the first pixel electrode, forming a second pixel electrode covering the exposed portion of the first pixel electrode through the first opening, the second pixel electrode covering at least a portion of the first bank, forming an organic light-emitting layer covering the second pixel electrode, and forming an opposite electrode covering the organic light-emitting layer.

The method may further include forming a second bank on the first bank, such that the second bank has a second opening that is wider than the first opening and the organic light-emitting layer covers the second pixel electrode in a region defined by the second opening.

Forming the first bank and the second bank may include forming the first bank and the second bank simultaneously using a half-tone mask and a same material.

Forming the second pixel electrode may include using a material having a different refractive index than a material of the first pixel electrode.

Forming the organic light-emitting layer may include applying a liquid organic material to the second pixel electrode, and drying.

Forming the second pixel electrode may include using at least one of ITO, IZO, ZnO, $In_2O_3$, IGO, and IZO.

Forming the second pixel electrode may include applying material to a thickness of about 100 nm or less.

Forming the second pixel electrode may include using a metallic material.

Forming the second pixel electrode may include applying a material to a thickness of about 10 nm or less.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE INVENTION

Figure 1:
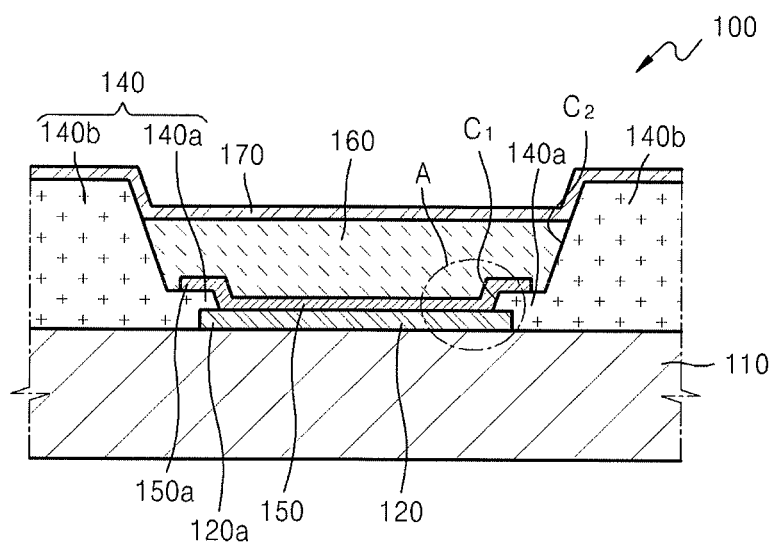
FIG. 1 illustrates a schematic sectional view of an organic light-emitting device according to example embodiments.

Korean Patent Application No. 10-2011-0080652, filed on Aug. 12, 2011, in the Korean Intellectual Property Office, and entitled, "Organic Light Emitting Device and Method of Manufacturing the Same," is incorporated herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, exemplary embodiments of an organic light-emitting device will be described in detail with reference to FIG. 1. FIG. 1 illustrates a schematic sectional view of an organic light-emitting device 100 according to example embodiments.

Referring to FIG. 1, a first pixel electrode 120 may be disposed on a substrate 110.

The substrate 110 may be formed of a transparent glass material, e.g., a material consisting essentially of $SiO_2$. However, the material for forming the substrate 110 is not limited thereto, and various other materials, e.g., a transparent plastic material or a metallic material, may be used to form the substrate 10.

The substrate 110, although not illustrated in FIG. 1, may include a plurality of pixel circuit units allotted to each pixel. Each of the pixel circuit units may include at least one thin film transistor (TFT). Any one of source and drain electrodes included in a TFT of each of the pixel circuit units is connected to at least a portion of the first pixel electrode 120. Also, the TFT may be disposed in a region that overlaps the first pixel electrode 120 on the substrate 110. Alternatively, the TFT may be disposed in a region that does not overlap the first pixel electrode 120.

The first pixel electrode 120 formed on the substrate 110 may be a transparent electrode, a semi-transparent electrode, or a reflective electrode. When the first pixel electrode 120 is a transparent or semi-transparent electrode, the first pixel electrode 120 may include at least one of, e.g., indium tin oxide (ITO), indium zinc oxide (IZO), zinc oxide (ZnO), indium oxide ($In_2O_3$), indium gallium oxide (IGO), and aluminum zinc oxide (AZO). When the first pixel electrode 120 is a reflective electrode, the first pixel electrode 120 may include a reflective film formed of, e.g., silver (Ag), magnesium (Mg), aluminum (Al), platinum (Pt), palladium (Pd), gold (Au), nickel (Ni), neodymium (Nd), iridium (Ir), and/or chromium (Cr), and a transparent or semi-transparent film, e.g., formed of the materials used to form the transparent or semi-transparent electrode described above, may be formed on the reflective film.

A bank 140 may be formed on the substrate 110, covering an edge 120a of the first pixel electrode 120. The bank 140 may include a first bank 140a and a second bank 140b.

The first bank 140a may be formed to cover the edge 120a of the first pixel electrode 120, and may have a first opening C1 exposing at least a portion, e.g., a central portion, of the first pixel electrode 120. The second bank 140b may be disposed on the first bank 140a, and may have a second opening C2 exposing a portion of each of the first pixel electrode 120 and the first bank 140a. Accordingly, the second opening C2 may be wider than the first opening C1, and the first bank 140a and the second bank 140b may have a step therebetween. The first opening C1 and the second opening C2 may form a tapered shape.

According to example embodiments, the first bank 140a and the second bank 140b may be integrally formed as one body and may be formed of the same material. For example, the first and second banks 140a and 140b may be formed of a hydrophilic organic material, e.g., a polyimide resin and/or an acrylic resin. A surface of the second bank 140b may be subjected to a hydrophobic treatment to prevent flooding of ink when an organic light-emitting layer 160 is formed.

According to other example embodiments, the first bank 140a and the second bank 140b may be formed of different materials. For example, the first bank 140a may be formed of a material that is more hydrophilic than that of the second bank 140b. However, example embodiments are not limited thereto, e.g., the first bank 140a and the second bank 140b may be formed of a same organic material and fluorine may be added to the second bank 140b. For example, fluorine may be used together with a polyimide resin or an acrylic resin to vary a level of a hydrophilicity according to height.

The first bank 140a may be formed to cover the edge 120a of the first pixel electrode 120 within about 10 μm or less from an end of the first pixel electrode 120. That is, the first bank 140a may overlap an edge portion of the first pixel electrode extending from an outermost end of the first pixel electrode 120 toward a center of the first pixel electrode 130 to a distance of about 10 μm or less.

When the first bank 140a and the second bank 140b, i.e., in particular the first bank 140a, is formed of an organic material, damage on a surface of the first pixel electrode 120 by patterning of the first bank 140a may be prevented. That is, because there is no need for forming an inorganic material on the surface of the first pixel electrode 120, e.g., by sputtering, the surface of the first pixel electrode 120 is not damaged.

The second bank 140b may define a region that is to be doped with ink when the organic light-emitting layer 160 is formed by printing. In this case, if the height of the second bank 140b is too small, the liquid organic doping material may leak beyond the second bank 140b. If the height of the second bank 140b is too great, an opposite electrode 170 may be separated from the organic light-emitting layer 160 by the second bank 140b. For example, the second bank 140b may be formed to have a height of about 0.5 μm to about 3 μm.

The height of the first bank 140a may be relatively low because a second pixel electrode 150 and the organic light-emitting layer 160 are formed on the first bank 140a. However, because the first bank 140a insulates the edge 120a of the first pixel electrode 120 from an edge 150a of the second pixel electrode 150, the first bank 140a may have a lower height than the second bank 140b. For example, the height of the first bank 140a may be about 0.1 μm to about 0.5 μm.

The second pixel electrode 150 may be formed on the exposed portion of the first pixel electrode 120 by the first opening C1 and at least one portion of the first bank 140a. The second pixel electrode 150 may be formed of a material that has a different refractive index from that of the first pixel electrode 120. The second pixel electrode 150 may be a transparent/semi-transparent electrode, regardless of the material of the first pixel electrode 120.

If the second pixel electrode 150 is a transparent electrode, the second pixel electrode 150 may include at least one of ITO, IZO, ZnO, $In_2O_3$, IGO, and AZO. If the second pixel electrode 150 is formed of a transparent metal oxide, the transparent metal oxide may be different from that of the first pixel electrode 120 to allow the second pixel electrode 150 to function as a resonance electrode. If the second pixel electrode 150 is the transparent electrode, a thickness of the second pixel electrode 150 may be about 100 nm or less, e.g., in a range of a few nm to a few tens nm.

If the second pixel electrode 150 is formed of a metallic material, e.g., at least one of Ag, Mg, Al, Pt, Pd, Au, Ni, Nd, Ir, and Cr may be used. In this case, the second pixel electrode 150 may be formed to have a thickness of about 10 nm or less, e.g., a few nm, thereby functioning as a semi-transparent electrode. If the second pixel electrode 150 is formed of a metallic material, i.e., to allow light penetrate therethrough, the thickness of the second pixel electrode 150 may be smaller than the thickness of a transparent second pixel electrode 150.

The second pixel electrode 150 may be formed in such a way that an edge thereof is formed on the first bank 140a and a central region thereof contacts the first pixel electrode 120. Accordingly, the first bank 140a may be interposed between edges of the first pixel electrode 120 and the second pixel electrode 150.

The organic light-emitting layer 160 may be formed on the second pixel electrode 150 within the region defined by the second opening C2. The organic light-emitting layer 160 may be formed by inkjet printing or nozzle printing. In this case, the organic light-emitting layer 160 may be formed of a polymer organic material. When the organic light-emitting layer 160 is formed of a polymer organic material, a hole transport layer (HTL) may be further included, in addition to the organic light-emitting layer 160. The HTL may include, e.g., poly-(2,4)-ethylene-dihydroxy thiophene (PEDOT) or polyaniline (PANI). An available organic material herein may be a poly-phenylenevinylene (PPV)-based or polyfluorene-based polymer organic material.

The formation process for the organic light-emitting layer 160 may not be limited thereto. For example, the organic light-emitting layer 160 may be formed by depositing a low molecular weight organic material. When the organic light-emitting layer 160 is formed of a low molecular weight organic material, an HTL, an hole injection layer (HIL), an electron transport layer (ETL), and an electron injection layer (EIL) may be deposited near the organic light-emitting layer 160. Also, various other layers may be deposited if necessary. An available organic material herein may be copper phthalocyanine (CuPc), N'-di(naphthalene-1-yl)-N, N'-diphenyl-benzidine (NPB), tris-8-hydroxyquinoline aluminum ($Alq_3$), or the like.

The opposite electrode 170 may be formed on the organic light-emitting layer 160 and the second bank 140b. The opposite electrode 170 may include at least one of Al, Mg, Li, Ca, LiF/Ca, and LiF/Al. The opposite electrode 170 may further include an auxiliary electrode layer or a bus electrode, each of which is formed of a transparent electrode forming material, such as ITO, IZO, ZnO, or $In_2O_3$. The opposite electrode 170 may be formed on the organic light-emitting layer 160 by depositing or sputtering.

In the example embodiments, the first pixel electrode 120 is used as an anode and the opposite electrode 170 is used as a cathode. However, the polarities of the first pixel electrode 120 and the opposite electrode 170 may be switched.

Figure 2:
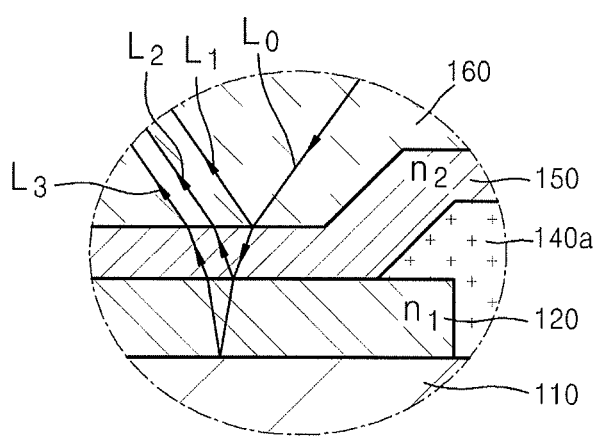
FIG. 2 illustrates a conceptual view for explaining a resonance principle of the organic light-emitting device of FIG. 1.

FIG. 2 is a conceptual view for explaining a resonance principle of the organic light-emitting device 100 of FIG. 1. FIG. 2 is an enlarged view of a region A of FIG. 1.

Referring to FIG. 2, the first pixel electrode 120 has a refractive index n1 and the second pixel electrode 150 has a refractive index n2. The refractive indices n1 and n2 are different from each other. In this structure, a portion of light $L_0$ that is emitted from the organic light-emitting layer 160 is incident on the second pixel electrode 150 and is transmitted therethrough toward the first pixel electrode 120. Another portion of light $L_0$ that is emitted from the organic light-emitting layer 160 is incident on the second pixel electrode 150 and is reflected as $L_1$ from the surface of the second pixel electrode 150 toward the organic light-emitting layer 160.

The portion of light transmitted through the second pixel electrode 150 toward the first pixel electrode 120 may be incident on an interface between the first pixel electrode 120 and the second pixel electrode 150, such that a first portion of the transmitted light is reflected from the interface to be further refracted toward the light emitting layer 160 at an interface between the second pixel electrode 150 and the organic light transmitting layer 160 as $L_2$. A second portion of the transmitted light is transmitted through the first pixel electrode 120 to be reflected from an interface between the first pixel electrode 120 and the substrate 110 and further refracted at each interface with the second pixel electrode 150 toward the organic light emitting layer 160 as $L_3$. The reflected lights $L_1$, $L_2$, and $L_3$ interfere constructively together under conditions satisfying Bragg's law. That is, the first pixel electrode 120 and the second pixel electrode 150 form a resonance structure, so the light efficiency and color reproduction property of the organic light-emitting device 100 may be improved.

When a conventional organic light-emitting layer of an organic light-emitting device is formed by printing, it may be difficult to realize a resonance structure. In detail, the thickness of the organic light-emitting layer may not be accurately controlled due to process characteristic of use of a solution, so the thickness of the resultant organic light-emitting layer may be hard to control according to the color of a pixel. Further, when different printing conditions are used, a mass-production time, e.g., takt-time, may be relatively long. However, if the first and second pixel electrode 120 and 150 according to example embodiments are formed directly on top of each other, even when the organic light-emitting layer 160 is manufactured by printing, a resonance structure may be easily embodied.

Figure 3:
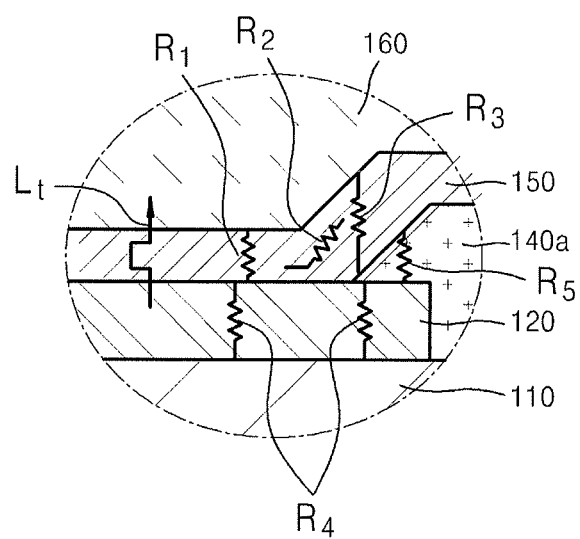
FIG. 3 illustrates a conceptual view for explaining how light extraction is suppressed at an edge of the organic light-emitting device of FIG. 1.

FIG. 3 is a conceptual view for explaining how light extraction is suppressed at an edge of the organic light-emitting device 100 of FIG. 1. FIG. 3 is an enlarged view of the region A of FIG. 1.

Referring to FIG. 3, the edge of the first pixel electrode 120 is spaced from the edge of the second pixel electrode 150 by the first bank 140a. The edge of the first bank 140a may be formed to have a tapered shape due to an exposure difference during etching, and the second pixel electrode 150 may be conformed to the tapered surface of the first bank 140a. In this case, the first pixel electrode 120 may have a thickness of about 200 nm or more and the second pixel electrode 150 may have a thickness of a few to few tens nm, i.e., the first pixel electrode 120 may be substantially thicker than the second pixel electrode 150.

Because the second pixel electrode 150 has a thickness of a few to few tens nm, the second pixel electrode 150 may function as a high resistor having high resistance values R1, R2, and R3, while the first pixel electrode 120 has a relatively small resistance value R4. Also, the first bank 140a separating the first pixel electrode 120 from the second pixel electrode 150 covers the edge of the first pixel electrode 120 and a thickness thereof increases toward the end of the first pixel electrode 120 along the tapered shape. A height, i.e., thickness, of the thickest portion of the first bank 140a may be in a range of about 0.1 to about 0.5 um. Accordingly, the first bank 140a may also have a high resistance value R5.

In a region in which the first bank 140a is not formed, the first pixel electrode 120 contacts the second pixel electrode 150. In this case, although the second pixel electrode 150 is a high resistor, tunneling Lt occurs, and thus, holes may be effectively transported to the organic light-emitting layer 160. Accordingly, light-emission may smoothly occur in the organic light-emitting layer 160.

However, in a region in which the first bank 140a is formed between the first and second pixel electrodes 120 and 150, holes supplied from the first pixel electrode 120 do not tunnel to the organic light-emitting layer 160 through the first bank 140a and the second pixel electrode 150 due to the high resistance R5 of the first bank 140a. Accordingly, the holes may fail to reach the organic light-emitting layer 160 at the edge of the first pixel electrode 120, and thus, light-emission may not occur. In the present embodiment, the first pixel electrode 120 is used as an anode. However, the first pixel electrode 120 may instead function as a cathode, and in this case, the first pixel electrode 120 provides electrons, not the holes.

When the organic light-emitting layer 160 is formed by printing, opposite edges of the organic light-emitting layer 160 may have non-uniform thicknesses when a liquid organic material is dried. This may result in non-uniform light emission at non-uniform edges of the organic light-emitting layer 160, e.g., cause pixels to seem to have a ring-shaped band (that is, a coffee ring effect.) The coffee ring effect may lead to a decrease in the quality of the organic light-emitting device 100.

According to example embodiments, however, light-emission does not occur in the region in which the first bank 140a is formed, e.g., at edges of the first and second pixel electrodes 120 and 150. That is, as light emission occurs only at a region in which the first pixel electrode 120 contacts the second pixel electrode 150, e.g., at central portions of the first and second pixel electrodes 120 and 150 contacting each other, the non-uniform thickness at edges of the organic light emitting layer 160, i.e., positioned beyond the first and second pixel electrodes 120 and 150, may not affect light emission. Accordingly, the phenomenon in which a pixel is viewed to have a ring-shaped band may be prevented, and thus a pixel quality and a photoluminescence quality of the organic light-emitting device 100 may be improved.

It is noted that example embodiments are not limited to the organic light-emitting layer 160 formed by inkjet printing or nozzle printing. For example, example embodiments may also be applied when an organic light-emitting layer is formed using other methods, e.g., sputtering or deposition.

FIGS. 4 to 9 illustrate cross-sectional views of a method of manufacturing the organic light-emitting device 100 of FIG. 1. Hereinafter, with reference to FIGS. 1 and 4-9, a method of manufacturing the organic light-emitting device 100 of FIG. 1 will be described in detail.

Figure 4:
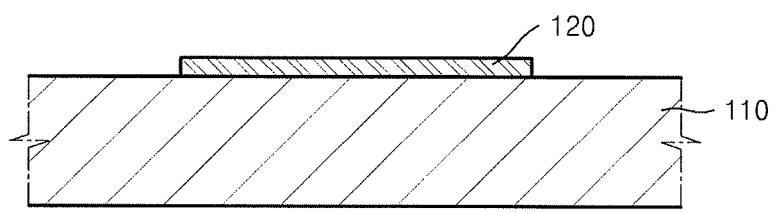
FIGS. 4 to 9 illustrate cross-sectional views of stages in a method of manufacturing an organic light-emitting device according to example embodiments.

Referring to FIG. 4, the first pixel electrode 120 may be formed on the substrate 110. The substrate 110 and the first pixel electrode 120 have already been described above.

Figure 5:
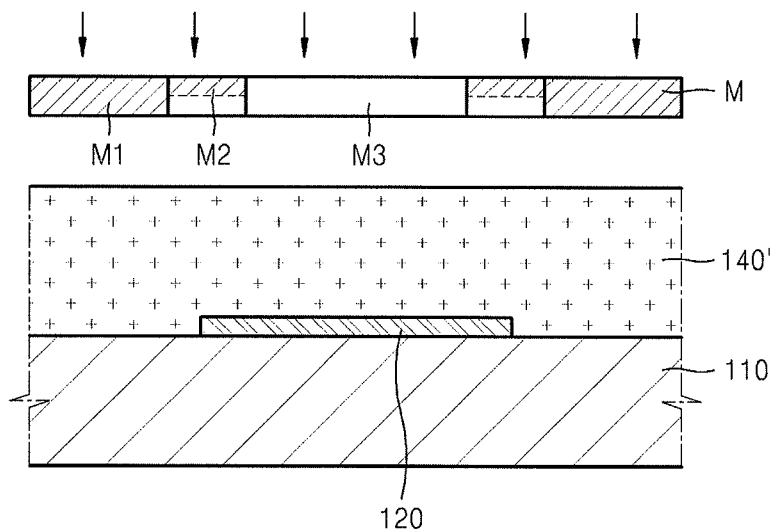

Referring to FIG. 5, an insulating material 140' may be deposited on the first pixel electrode 120, and the first bank 140a and the second bank 140b (shown in FIG. 6) may be formed using a half-tone mask M. The insulating material 140' may be an organic material, and may be deposited on the whole surface of the substrate 110, e.g., by spin coating, to cover the first pixel electrode 120, e.g., to completely cover the first pixel electrode 120. The first bank 140a and the second bank 140b may be formed using a photolithography process using a half-tone mask M. When the insulating material 140' is a photo-sensitive organic material, a separate photoresist may not be required. The half-tone mask M refers to a mask of which a transmission rate is controllable according to a region. The half-tone mask M may include a blocking portion M1 disposed to correspond to the second bank 140b, a semi-transmission portion M2 disposed to correspond to the first bank 140a, and a transmission portion M3 disposed to correspond to the exposed region of the first pixel electrode 120.

Figure 6:
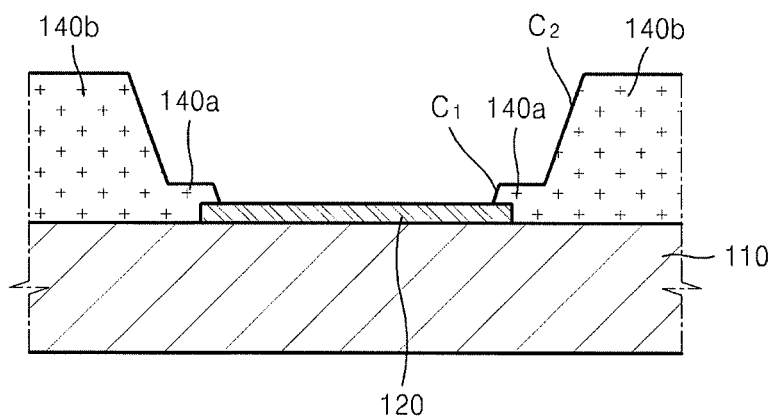

An exposure process is performed thereon using an exposure apparatus (not shown) using the half-tone mask M, followed by development and etching, thereby forming the first bank 140a and the second bank 140b with different heights. That is, as illustrated in FIG. 6, during the exposure process a portion of the insulating material 140' overlapping the transmission portion M3 of the half-tone mask M is removed to form the first bank 140a with the first opening C1 and expose the first pixel electrode 120. Similarly, a portion of the insulating material 140' overlapping the semi-transmission portion M2 of the half-tone mask M is removed to form the second bank 140b with the second opening C2 and expose edges of the first bank 140a. It is noted, however, that the method of forming the first bank 140a and the second bank 140b is not limited to the method using the half-tone mask M. Also, it is not necessary that the first bank 140a and the second bank 140b are formed of the same organic material. For example, the first bank 140a and the second bank 140b may instead be formed of different organic materials. However, when the half-tone mask M or a slit mask is used as described above, the manufacturing process may be simplified because the first bank 140a and the second bank 140b may be simultaneously formed using one mask process.

Figure 7:
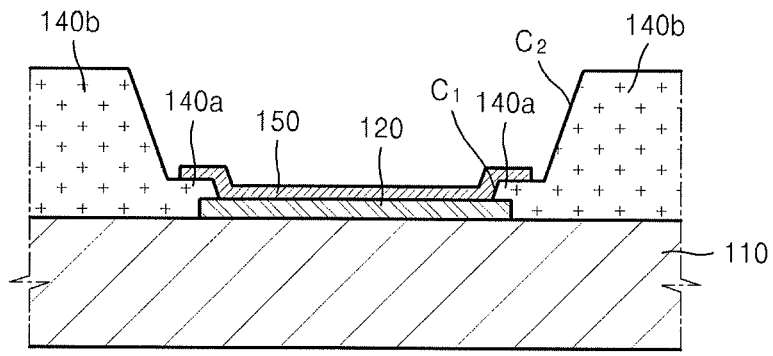

Referring to FIG. 7, the second pixel electrode 150 may be formed on the exposed portions of the first pixel electrode 120 and the first bank 140a. For example, the second pixel electrode 150 may be formed to conformally trace boundaries of the first opening C1, so the second pixel electrode 150 may overlap the entire portion of the first pixel electrode 120 exposed through the first opening C1 and may extend to cover, e.g., directly cover, edges of the first bank 140a.

Figure 8:
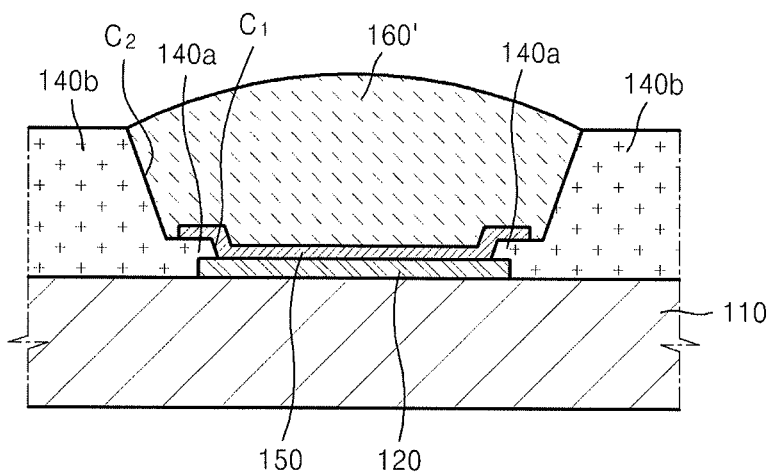
Figure 9:
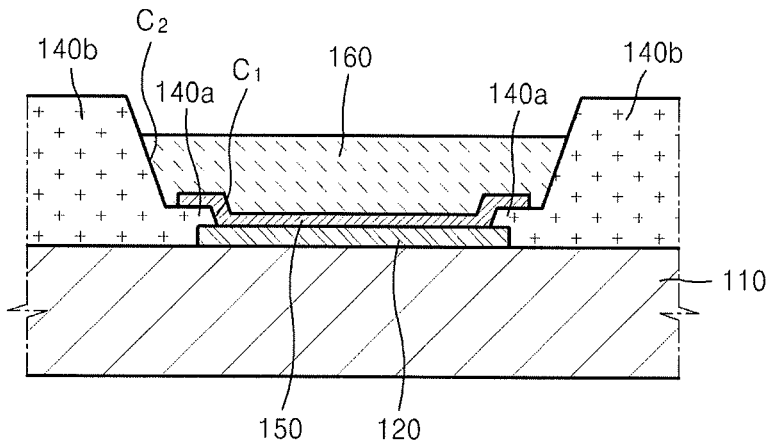

Referring to FIGS. 8-9, an ink 160' may be applied to the region defined by the second opening C2 of the second bank 140b by inkjet printing or nozzle printing to cover the second pixel electrode 150 and to fill, e.g., completely fill, the second opening C2. The ink 160' may be dried and/or cured to form the organic light-emitting layer 160.

Referring back to FIG. 1, the opposite electrode 170 may be formed on the second bank 140b, covering the organic light-emitting layer 160, thereby completing the manufacture of the organic light-emitting device 100. The opposite electrode 170 may be formed by depositing or sputtering.

As described above, the first bank 140a and the second bank 140b are formed of an organic material. However, example embodiments are not limited thereto, e.g., an inorganic material may be used to form the first bank 140a and the second bank 140b.

Figure 10:
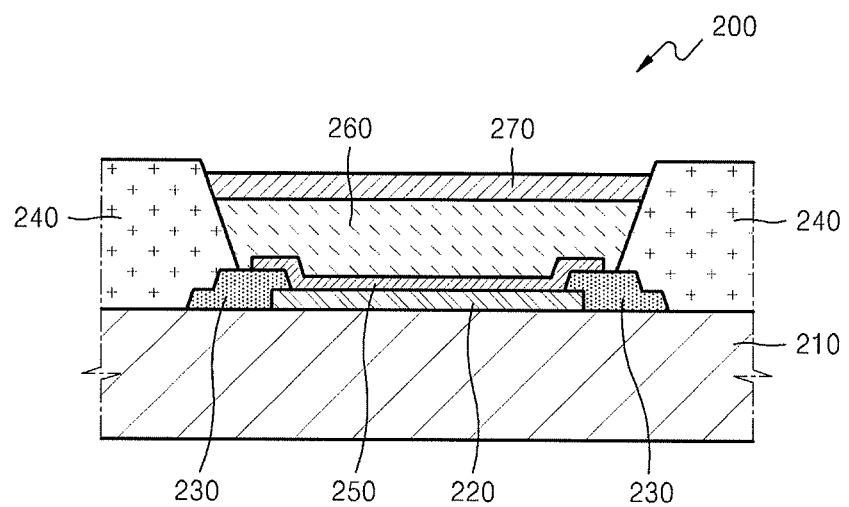
FIG. 10 illustrates a schematic sectional view of an organic light-emitting device according to other example embodiments.

FIG. 10 is a cross-sectional view of an organic light-emitting device 200 according to another embodiment. Hereinafter, only a difference between the organic light-emitting device 100 and the organic light-emitting device 200 will be described in detail.

Referring to FIG. 10, a first bank 230 formed covering an edge of a first pixel electrode 220 may be formed of a material that is different from that of a second bank 240 formed on the first bank 230. For example, the first bank 230 may be formed of an inorganic material, e.g., at least one of silicon nitride ($SiN_x$) and silicon oxide ($SiO_2$), and the second bank 240 may be formed of an organic material.

When the first bank 230 is formed of the inorganic material, due to its high hydrophilic property, adherence between the first bank 230 and the organic light-emitting layer 260 may be enhanced. The first bank 230 may be formed by depositing an inorganic material on the first pixel electrode 220, e.g., by spin coating, followed by application of a photoresist and a photolithography process for patterning. After the first bank 230 is formed, the second bank 240 may be formed using an organic material.

However, example embodiments are not limited thereto. For example, the first bank 230 and the second bank 240 may instead be formed of different organic materials. In this case, damage to the first pixel electrode 220, e.g., potentially occurring when the first bank 230 is formed, may be prevented. Although, in the present embodiment, the second pixel electrode 220 is formed after formation of the first bank 230 and the second bank 240, the second pixel electrode 220 may be formed between formation of the first and second banks 230 and 240. In the latter case, the second bank 240 may be formed completely or incompletely exposing the second pixel electrode 220.

Also, FIG. 10 illustrates an example of a case in which an opposite electrode 270 is formed in only a region that is defined by the second bank 240. If the organic light-emitting device 200 is an active matrix type organic light-emitting device, the opposite electrode 270 may be formed above the whole surface of the substrate 210 as a common electrode. However, if the organic light-emitting device 200 is a passive matrix type organic light-emitting device, as illustrated in FIG. 10, the opposite electrode 270 may be formed only on the organic light-emitting layer 260. In the latter case, the second bank 240 may function as a separator, in addition to functioning as a definer that defines a light-emission region.

According to example embodiments, photoluminescence efficiency of an organic light-emitting device may be improved due to the inclusion of two pixel electrodes contacting each other and forming a resonance structure. Also, when an organic light-emitting device is manufactured by printing, a quality of extracted light may be improved by suppressing light-emission at an edge of the light light-emitting portion.

In contrast, conventional organic light-emitting display apparatuses, e.g., an apparatus with a single pixel electrode, may have a wide photoluminescence wavelength range, thereby exhibiting a relatively lower photoluminescence efficiency and color purity. Also, because light emitted from an organic light-emitting layer in the conventional organic light-emitting display apparatus does not have a particular orientation, many photons emitted in an arbitrary direction may fail to reach a viewer due to inner total-reflection in the organic light-emitting apparatus, thereby decreasing light extraction efficiency of the organic light-emitting apparatus.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the example embodiments as set forth in the following claims.

What is claimed is:

1. An organic light-emitting device, comprising:
    a first pixel electrode disposed on a substrate;
    a first bank covering an edge of the first pixel electrode, the first bank having a first opening exposing a portion of the first pixel electrode;
    a second pixel electrode covering the exposed portion of the first pixel electrode through the first opening, the second pixel electrode covering at least a portion of the first bank;
    a second bank on the first bank, the second bank including a second opening wider than the first opening and exposing the second pixel electrode;
    an organic light-emitting layer covering the second pixel electrode; and
    an opposite electrode covering the organic light-emitting layer,
    wherein the second pixel electrode includes a center portion directly contacting the first pixel electrode and a side portion extending from the center portion, the side portion of the second pixel electrode including an end disposed on an upper surface of the first bank exposed through the second opening.

2. The organic light-emitting device as claimed in claim 1, wherein the first pixel electrode and the second pixel electrode include materials having different refractive indices.

3. The organic light-emitting device as claimed in claim 2, wherein the second pixel electrode is directly between the first pixel electrode and the organic light emitting layer, the first and second pixel electrodes being in direct surface contact.

4. The organic light-emitting device as claimed in claim 1, wherein first respective parts of the first and second pixel electrodes are in direct contact with each other, and a portion of the first bank is between respective second parts of the first and second pixel electrodes.

5. The organic light-emitting device as claimed in claim 1, wherein a thickness of the first bank is about 1 μm or less.

6. The organic light-emitting device as claimed in claim 1, wherein the first bank and the second bank include a same organic material.

7. The organic light-emitting device as claimed in claim 1, wherein the second pixel electrode includes at least one of ITO, IZO, ZnO, $In_2O_3$, IGO, and IZO.

8. The organic light-emitting device as claimed in claim 7, wherein a thickness of the second pixel electrode is about 100 nm or less.

9. The organic light-emitting device as claimed in claim 1, wherein the second pixel electrode includes a metallic material.

10. The organic light-emitting device as claimed in claim 9, wherein a thickness of the second pixel electrode is about 10 nm or less.

11. A method of manufacturing an organic light-emitting device, the method comprising:
    forming a first pixel electrode on a substrate;
    forming a first bank covering an edge of the first pixel electrode, the first bank having a first opening exposing a portion of the first pixel electrode;
    forming a second pixel electrode covering the exposed portion of the first pixel electrode through the first opening, the second pixel electrode covering at least a portion of the first bank;
    forming a second bank on the first bank, such that the second bank has a second opening that is wider than the first opening and the organic light-emitting layer covers the second pixel electrode in a region defined by the second opening;
    forming an organic light-emitting layer covering the second pixel electrode; and
    forming an opposite electrode covering the organic light-emitting layer,
    wherein the second pixel electrode includes a center portion directly contacting the first pixel electrode and a side portion extending from the center portion, such that the side portion of the second pixel electrode includes an end disposed on an upper surface of the first bank exposed through the second opening.

12. The method as claimed in claim 11, wherein forming the first bank and the second bank includes forming the first bank and the second bank simultaneously using a half-tone mask and a same organic material.

13. The method as claimed in claim 11, wherein forming the second pixel electrode includes using a material having a different refractive index than a material of the first pixel electrode.

14. The method as claimed in claim 11, wherein forming the organic light-emitting layer includes applying a liquid organic material to the second pixel electrode, and drying.

15. The method as claimed in claim 11, wherein forming the second pixel electrode includes using at least one of ITO, IZO, ZnO, $In_2O_3$, IGO, and IZO.

16. The method as claimed in claim 15, wherein forming the second pixel electrode includes applying material to a thickness of about 100 nm or less.

17. The method as claimed in claim 11, wherein forming the second pixel electrode includes using a metallic material.

18. The method as claimed in claim 17, wherein forming the second pixel electrode includes applying a material to a thickness of about 10 nm or less.

19. An organic light-emitting device, comprising:
a first pixel electrode disposed on a substrate;
a first bank covering an edge of the first pixel electrode, the first bank having a first opening exposing a portion of the first pixel electrode;
a second pixel electrode covering the exposed portion of the first pixel electrode through the first opening, the second pixel electrode covering at least a portion of the first bank;
a second bank on the first bank, the second bank including a second opening wider than the first opening and exposing the second pixel electrode;
an organic light-emitting layer covering the second pixel electrode; and
an opposite electrode covering the organic light-emitting layer,
wherein a width of the second pixel electrode is narrower than a width of the second opening.

\* \* \* \* \*